(12) United States Patent
Groenhuis et al.

(10) Patent No.: US 10,056,343 B2
(45) Date of Patent: Aug. 21, 2018

(54) PACKAGED SEMICONDUCTOR DEVICE WITH INTERIOR POLYGONAL PADS

(71) Applicant: Nexperia B.V., Nijmegen (NL)

(72) Inventors: Roelf A. J. Groenhuis, Nijmegen (NL); Kan Wae Lam, Utrecht (NL); Clifford J. Lloyd, Los Altos, CA (US); Chi Hoo Wan, Kwai Chung (HK); Fei Ying Wong, Tung Chung (HK)

(73) Assignee: Nexperia B.V., Nijmegen (NL)

( * ) Notice: Subject to any disclaimer, the term of this patent is extended or adjusted under 35 U.S.C. 154(b) by 125 days.

(21) Appl. No.: 14/990,304

(22) Filed: Jan. 7, 2016

(65) Prior Publication Data

US 2016/0118357 A1    Apr. 28, 2016

Related U.S. Application Data

(62) Division of application No. 14/099,768, filed on Dec. 6, 2013, now Pat. No. 9,269,690.

(51) Int. Cl.
*H01L 23/48* (2006.01)
*H01L 23/00* (2006.01)
*H01L 23/495* (2006.01)
*H01L 23/31* (2006.01)

(52) U.S. Cl.
CPC .......... *H01L 24/06* (2013.01); *H01L 23/4951* (2013.01); *H01L 23/49541* (2013.01);
(Continued)

(58) Field of Classification Search
CPC . H01L 23/49548; H01L 24/06; H01L 23/3114
See application file for complete search history.

(56) References Cited

U.S. PATENT DOCUMENTS 5,329,157 A    7/1994  Rosotker
6,597,059 B1   7/2003  McCann et al.
(Continued)

FOREIGN PATENT DOCUMENTS

CN    202285233 U    6/2012
WO    2012116271 A2  8/2012

OTHER PUBLICATIONS

Extended European Search Report, 14188355.3, dated Jun. 10, 2015.

*Primary Examiner* — Robert Huber
*Assistant Examiner* — Laura Dykes
(74) *Attorney, Agent, or Firm* — Ohlandt, Greeley, Ruggiero & Perle, L.L.P.

(57) ABSTRACT

Embodiments of a packaged semiconductor device with interior polygon pads are disclosed. One embodiment includes a semiconductor chip and a package structure defining a rectangular boundary and having a bottom surface that includes interior polygonal pads exposed at the bottom surface of the package structure and located on a centerline of the bottom surface of the package structure and edge polygonal pads exposed at the bottom surface of the package structure, located at an edge of the rectangular boundary, and including one edge polygonal pad in the vicinity of each corner of the rectangular boundary. The interior polygonal pads are configured such that a line running between at least one vertex of each of the interior polygonal pads is parallel to an edge of the rectangular boundary of the package structure.

10 Claims, 8 Drawing Sheets

(52) U.S. Cl.
CPC ........ *H01L 23/49555* (2013.01); *H01L 24/05* (2013.01); *H01L 24/67* (2013.01); *H01L 23/3107* (2013.01); *H01L 24/29* (2013.01); *H01L 24/32* (2013.01); *H01L 24/48* (2013.01); *H01L 24/73* (2013.01); *H01L 2224/05552* (2013.01); *H01L 2224/06164* (2013.01); *H01L 2224/2919* (2013.01); *H01L 2224/32245* (2013.01); *H01L 2224/48247* (2013.01); *H01L 2224/73265* (2013.01); *H01L 2924/00014* (2013.01); *H01L 2924/10161* (2013.01)

(56) References Cited

U.S. PATENT DOCUMENTS

| | | | |
|---|---|---|---|
| 6,873,032 B1 | 3/2005 | McCann et al. | |
| 8,330,270 B1* | 12/2012 | Lin | H01L 21/4828 257/666 |
| 2003/0189222 A1* | 10/2003 | Itou | H01L 21/4828 257/200 |
| 2004/0021220 A1* | 2/2004 | Kubo | H01L 23/3677 257/706 |
| 2007/0052070 A1* | 3/2007 | Islam | H01L 21/561 257/666 |
| 2007/0252247 A1* | 11/2007 | Kim | H01L 23/49503 257/666 |
| 2010/0084756 A1 | 4/2010 | Dirks et al. | |
| 2011/0068442 A1 | 3/2011 | Satoh et al. | |
| 2012/0018896 A1 | 1/2012 | Koga et al. | |
| 2012/0091571 A1 | 4/2012 | Koga et al. | |
| 2012/0168946 A1 | 7/2012 | Yasunaga | |
| 2012/0217044 A1 | 8/2012 | Koduri | |
| 2013/0133193 A1 | 5/2013 | Hsu et al. | |

* cited by examiner

PACKAGED SEMICONDUCTOR DEVICE WITH INTERIOR POLYGONAL PADS

A major trend in the semiconductor packaging industry is to use surface-mount technology (SMT) as a replacement for conventional plated-through-hole (PTH) technology. SMT offers several distinct advantages over PTH technology, such as greater packaging density, higher lead counts with shorter interconnection lengths and easier automation. Examples of SMT packaging technologies include "quad flat non-leaded (QFN)" packages and small-outline no-lead (SON) packages. QFN and SON packaged semiconductor devices have a relatively new flat no-lead package structure, in which space-consuming outer leads protruding laterally out of a package, are eliminated. Instead, external electrode pads are provided on a bottom surface of the QFN or SON packages for connection to a printed circuit board.

As the size of flat no-lead packages is driven down, it is important to maintain adequate space between the pads to reduce or prevent electric interference between the pads. For example, it is desirable to maximize the distance between the exposed pads on the bottom surface of the packages while still providing enough pad surface area to enable a reliable physical and electrical connection to the printed circuit board.

Embodiments of a packaged semiconductor device with interior polygon pads are disclosed. One embodiment of a semiconductor device includes a semiconductor chip and a package structure defining a rectangular boundary and having a bottom surface. The package structure includes interior polygonal pads and edge polygonal pads. The interior polygonal pads are exposed at the bottom surface of the package structure and are located on a centerline of the bottom surface of the package structure. The edge polygonal pads are exposed at the bottom surface of the package structure, are located at an edge of the rectangular boundary, and include one edge polygonal pad in the vicinity of each corner of the rectangular boundary. Each of the interior polygonal pads has a first side that is parallel to a facing side of the edge polygonal pad that is nearest to the first side and a second side that is parallel to a facing side of the edge polygonal pad that is nearest to the second side. The interior polygonal pads are configured such that a line running between at least one vertex of each of the interior polygonal pads is parallel to an edge of the rectangular boundary of the package structure. In an embodiment, the configuration of the interior polygonal pads and the edge polygonal pads exhibits a large pitch, e.g., which exceeds 0.4 mm, and a separation distance of around 0.2 mm. Thus, the packaged semiconductor device provides pad separation distances that are wide enough to prevent shorting between the pads while still providing pads with enough surface area to enable reliable physical and electrical connection to a printed circuit board.

In an embodiment, the semiconductor device has only two interior polygonal pads and only four edge polygonal pads. In a further embodiment, the two internal polygonal pads are triangular and a line running through one vertex of each of the interior polygonal pads is parallel to an edge of the rectangular boundary of the package structure. In a further embodiment, the line running through one vertex of each of the interior polygonal pads is a centerline of the rectangular boundary of the package structure. In an embodiment, the two interior polygonal pads are two equilateral triangular pads.

In an embodiment, the semiconductor device has only two interior polygonal pads and only six edge polygonal pads. In a further embodiment, the two internal polygonal pads are quadrilaterals and a line running between two vertices of each of the interior polygonal pads is parallel to an edge of the rectangular boundary of the package structure. In a further embodiment, the line running between the two vertices of each of the interior polygonal pads is a centerline of the rectangular boundary of the package structure.

In an embodiment, the interior polygonal pads have side dimensions of 0.15 mm-0.25 mm.

In an embodiment, the pitch of the interior polygonal pads is approximately 0.4 mm.

Another embodiment of a semiconductor device is disclosed. The semiconductor device includes a semiconductor chip and a package structure defining a rectangular boundary and having a bottom surface. The package structure includes two triangular pads and four polygonal pads. The two triangular pads are exposed at the bottom surface of the package structure and are located on a centerline of the bottom surface of the package structure. The four polygonal pads are exposed at the bottom surface of the package structure, are located in the vicinity of the corners of the rectangular boundary, and a side of each of the four polygonal pads is parallel to a side of each of the two triangular pads. In an embodiment, the two triangular pads are two equilateral triangular pads Another embodiment of a semiconductor device is disclosed. The semiconductor device includes a semiconductor chip and a package structure defining a rectangular boundary and having a bottom surface. The package structure includes two equilateral triangular pads and four trapezoidal pads. The two equilateral triangular pads are exposed at the bottom surface of the package structure and each of the two equilateral triangular pads having a side that is parallel to the other of the two equilateral triangular pads, the two equilateral triangular pads being located on a centerline of the rectangular boundary of the package structure. The four trapezoidal pads are exposed at the bottom surface of the package structure and are being located in the vicinity of the corners of the rectangular boundary. A first side of each of the four trapezoidal pads abuts the rectangular boundary and an opposite second side of each of the four trapezoidal pads is parallel to a side of each of the two equilateral triangular pads.

In an embodiment, the two equilateral triangular pads have side dimensions of approximately 0.25 mm and the opposite side of each of the four trapezoidal pads is separated from a nearest parallel side of one of the two equilateral triangular pads by approximately 0.2 mm.

Other aspects in accordance with the invention will become apparent from the following detailed description, taken in conjunction with the accompanying drawings, illustrated by way of example of the principles of the invention.

Throughout the description, similar reference numbers may be used to identify similar elements.

Figure 1A:
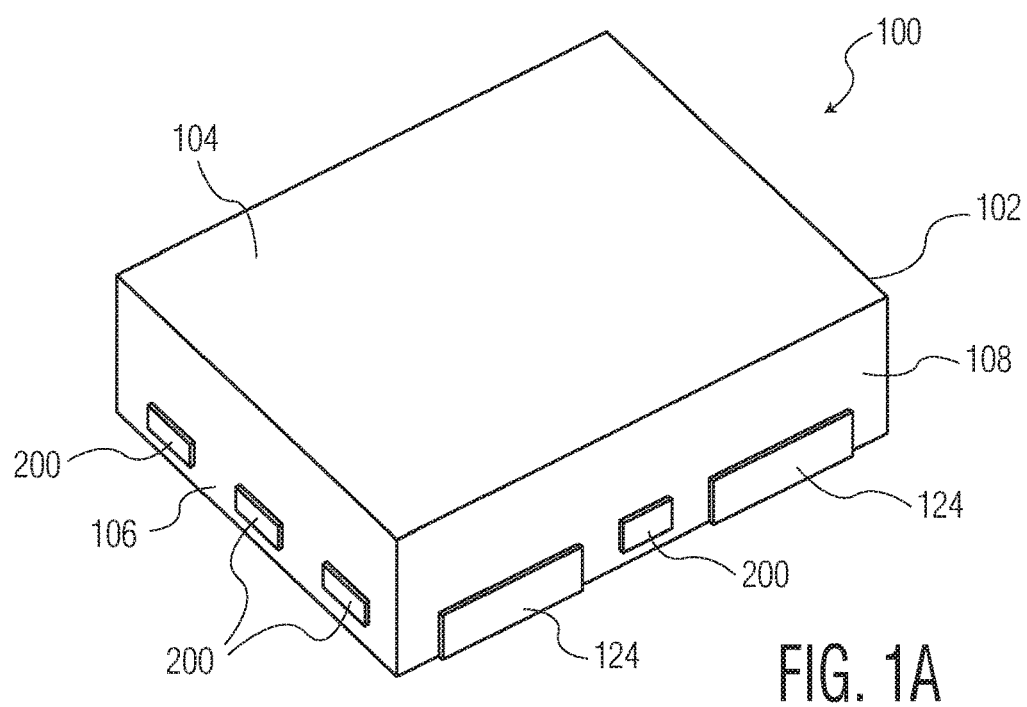
FIGS. 1A and 1B depict top and bottom perspective views of a six-pad semiconductor device that has been packaged using a flat no-lead technique in accordance with an embodiment of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Flat no-lead packages, such as quad-flat no-lead (QFN) packages, dual-flat no-lead (DFN) packages, and small-outline no-lead (SON) packages are used to physically and electrically connect semiconductor chips, i.e., integrated circuit (IC) devices, to printed circuit boards. These flat no-lead packaged semiconductor devices are connected to printed circuit boards using surface mount techniques (e.g., SMT) and without through-holes in the printed circuit boards. For example, pads at the bottom surface of such a packaged semiconductor device are soldered to corresponding connection points on a printed circuit board to form a physical connection to the printed circuit board and to form electrical connections to the packaged semiconductor chip. As used herein, a "pad" of a packaged semiconductor device refers to an area of a conductive member that is exposed at the bottom surface of a flat no-lead package. Other terms that are commonly used to describe pads of a packaged semiconductor device include, for example, terminals, leads, pins, landings, and landing pads. The term "pad" is used herein for consistency although other terms, such as the terms described above, could be used to reference the same or similar elements.

Figure 1B:
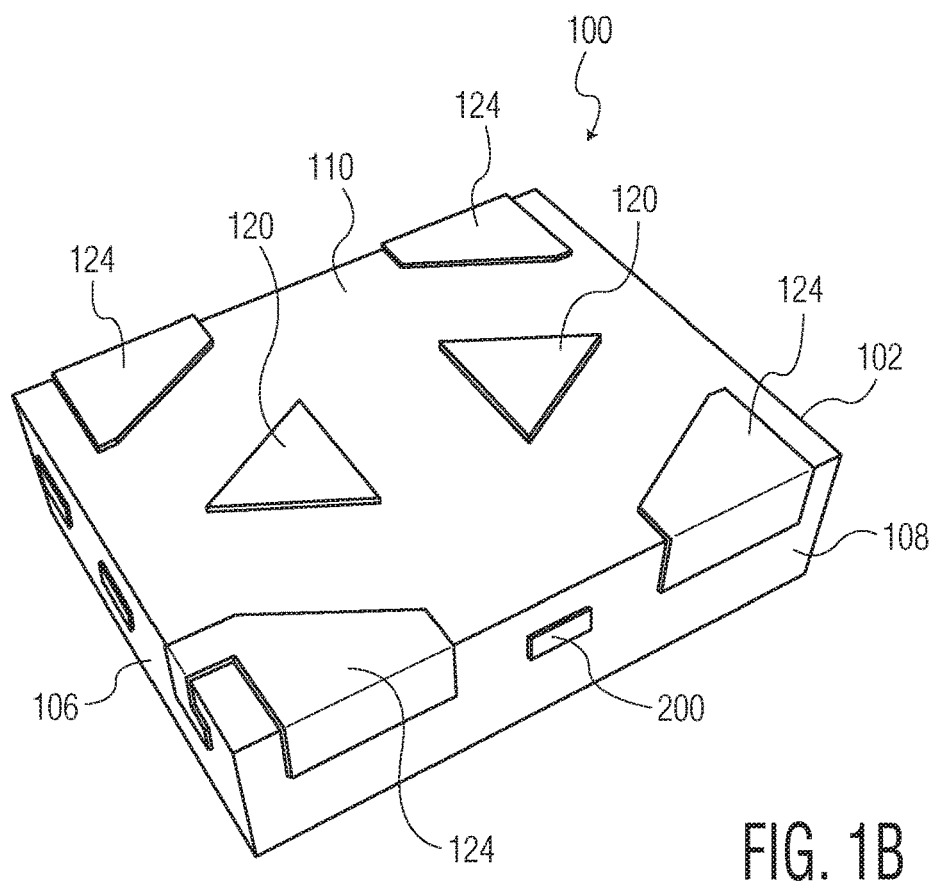

As the size of flat no-lead packages is driven down, it is important to maintain adequate space between the pads to reduce or prevent electric interference between the pads while still providing enough pad surface area to enable reliable physical and electrical connection to a printed circuit board. For example, it is desirable to maximize the distance between the exposed pads on the bottom surface of the packages while maintaining a desired pad surface area. In an embodiment, the distance between pads, as measured from the pad centers, is referred to as the "pitch." One particularly useful flat no-lead package for logic devices includes six exposed pads that correspond to six conductive terminals or pins on the packaged semiconductor chip. FIGS. 1A and 1B depict top and bottom perspective views of a semiconductor device 100 with six pads that has been packaged using a flat no-lead technique in accordance with an embodiment of the invention. In the embodiment of FIGS. 1A and 1B, the packaged semiconductor device is a six pad flat no-lead packaged semiconductor device with dimensions of approximately 1.0 mm×0.8 mm×0.35 mm (length x width x height) that includes two interior triangular pads and four edge polygonal pads. The configuration of the two interior triangular pads and the four edge polygonal pads exhibits a large pitch, e.g., which exceeds 0.4 mm, and a separation distance of around 0.2 mm. Thus, the six pad flat no-lead packaged semiconductor device provides pad separation distances that are wide enough to prevent shorting between the pads while still providing pads with enough surface area to enable reliable physical and electrical connection to a printed circuit board.

FIG. 1A is a top perspective view of the six pad flat no-lead packaged semiconductor device 100 that depicts a package structure 102 with a top major surface 104 and two side surfaces 106 and 108. As is known in the field, the top surface typically includes markings such as product markings, although no marking are shown here. Also, as illustrated in FIG. 1A, portions of the pads 124 and/or corresponding leadframe 200 are exposed at the side surfaces of the flat no-lead packaged semiconductor device.

FIG. 1B is a bottom perspective view of the six pad flat no-lead packaged semiconductor device 100 that depicts a bottom major surface 110 and two side surfaces 106 and 108 of the package structure 102. As illustrated in FIG. 1B, two triangular pads 120 (e.g., equilateral triangles) and four polygonal (e.g., trapezoidal) pads 124 are exposed at the bottom surface of the flat no-lead packaged semiconductor device. In general, the combination of the two equilateral triangular pads and the four polygonal pads arranged as shown in FIG. 1B provides a six pad layout that optimizes (e.g., maximizes) the separation distances between the six pads. Specifics of the pad layout are described in more detail below with reference to FIGS. 2 and 3A-3C.

Figure 2:
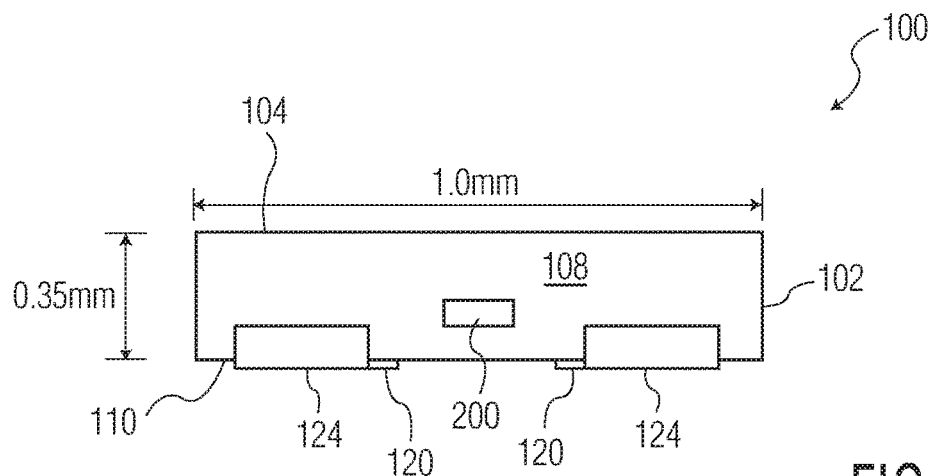
FIG. 2 is a side view of the flat no-lead packaged semiconductor device of FIGS. 1A and 1B.

FIG. 2 is a side view of the flat no-lead packaged semiconductor device 100 of FIGS. 1A and 1B that depicts the height dimension and the length dimension of the flat no-lead packaged semiconductor device. In the embodiment of FIG. 2, the height dimension is 0.35 mm and the length dimension is 1.0 mm. FIG. 2 also illustrates that the pads 120 and 124 may protrude from a plane defined by the bottom major surface 104 of the package structure 102 of the flat no-lead packaged semiconductor device 100. For example, the pads may protrude up to 20 micrometers from the bottom major surface of the package structure. In other embodiments, the pads do not protrude from the bottom major surface of the package structure, e.g., the pads are flush with the bottom major surface of the package structure.

Figure 3A:
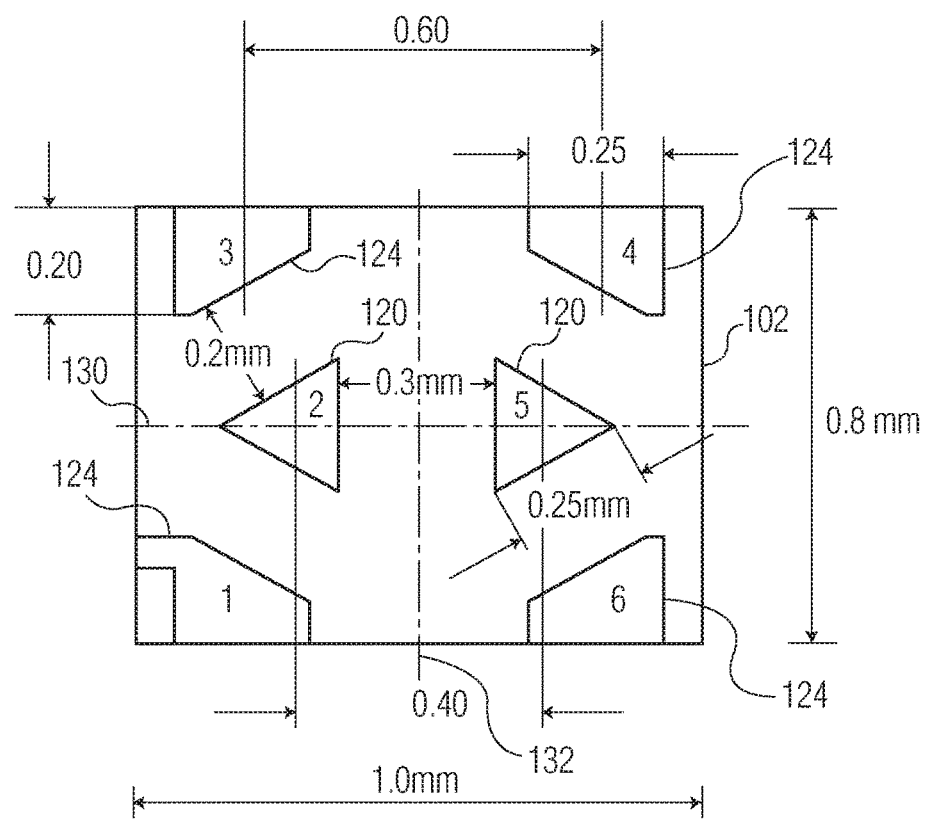
FIG. 3A is a plan view of the bottom surface of the flat no-lead packaged semiconductor device of FIGS. 1A and 1B.

FIG. 3A depicts a plan view of the bottom surface 110 of the flat no-lead packaged semiconductor device 100 that shows an embodiment of a layout of the six pads, including two equilateral triangular pads 120 identified as pads 2 and 5 and four polygonal pads 124 identified as pads 1, 3, 4, and 6. In an embodiment, pad 2 is a ground pad for connection to a ground terminal of the semiconductor chip and pad 5 is a Vcc pad for connection to a Vcc terminal of the semiconductor chip. The basic dimensions of the flat no-lead packaged semiconductor device are described first followed by a description of the orientation of the pads. As shown in FIG. 3A, the bottom surface has a rectangular boundary of approximately 1.0 mm×0.8 mm (e.g., length×width), the two equilateral triangular pads have sides of approximately 0.25 mm, and the nearest two parallel sides of the two different pads are separated from each other by approximately 0.3 mm. In an embodiment, the dimensions of the pads and separations distances are within ±0.05 mm.

Orientation of the pads 120 and 124 is now described with reference to FIGS. 3A-3C. As shown in FIG. 3A, the two equilateral triangular pads 120 are located on the horizontal centerline 130 that runs through the bottom surface 110. In the embodiment of FIG. 3A, the equilateral triangular pads are oriented such that one vertex of each equilateral triangular pad is located on the horizontal centerline and such that the side opposite the vertex (the vertex which is located on the horizontal centerline) is intersected by the horizontal centerline. Additionally, the two equilateral triangular pads have one side that is parallel to the vertical centerline 132 of the bottom surface, with the parallel side of each equilateral triangular pad being equidistant from the vertical centerline.

The four polygonal pads 124 are located in the vicinity of the corners of the rectangular boundary of the bottom surface 110. For example, each one of the four polygonal pads is located nearest to a different one of the four corners of the rectangular boundary of the bottom surface. In other words, the polygonal pad that is located nearest a particular corner is considered to be in the vicinity of that particular corner. As shown in FIG. 3A, each of the polygonal pads has a side that abuts an edge of the rectangular boundary and a side opposite to the abutting side (referred to as an "inner" side), which is parallel to a side of each of the two equilateral triangular pads 120. The parallel arrangement of the various sides of the pads enables maximum separation distance between pads and is described with reference to FIGS. 3B and 3C.

Figure 3B:
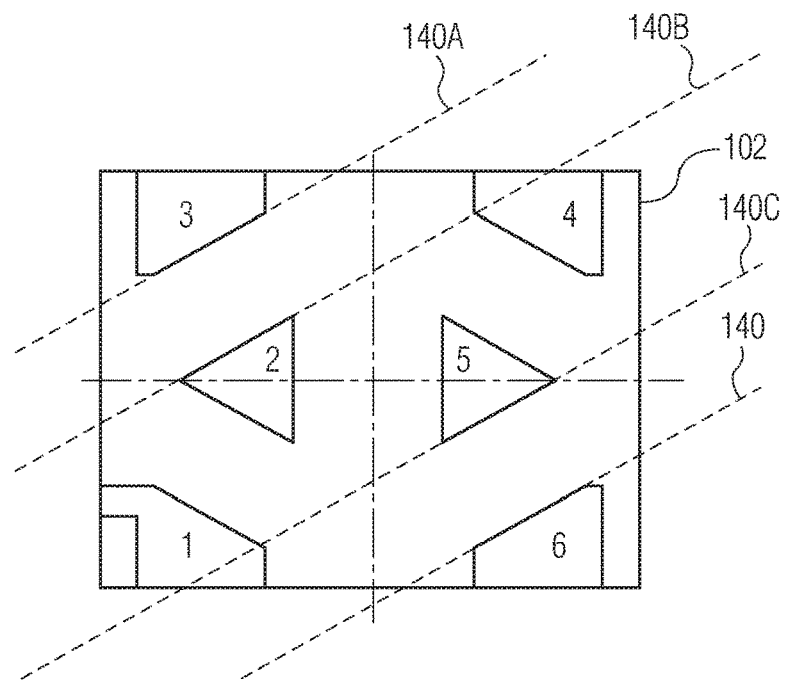
FIG. 3B depicts the bottom surface of the packaged semiconductor device of FIG. 3A with parallel lines running from the lower left to the upper right to indicate parallel sides of the pads.

FIG. 3B depicts the bottom surface 110 of the packaged semiconductor device 100 of FIG. 3A, with parallel lines 140A-140D running from the lower left to the upper right to indicate parallel sides of the pads 120 and 124. As illustrated in FIG. 3B, polygonal pad 3 and polygonal pad 6 each have an inner side that is parallel to one side of each of the two equilateral triangular pads. Specifically, polygonal pad 3 has an inner side that is parallel to the nearest side of equilateral triangular pad 2 and polygonal pad 6 has an inner side that is parallel to the nearest side of equilateral triangular pad 5. The inner side of polygonal pad 3 is also parallel to a side of equilateral triangular pad 5 and to the inner side of polygonal pad 6 and the inner side of polygonal pad 6 is parallel to a side of equilateral triangular pad 2 and to the inner side of polygonal pad 3.

Figure 3C:
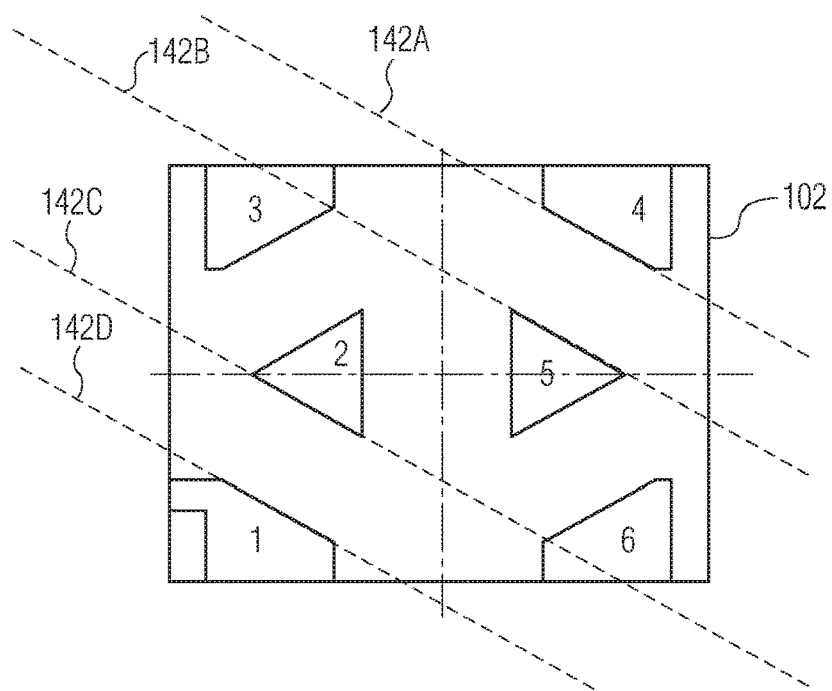
FIG. 3C depicts the bottom surface of the packaged semiconductor device of FIG. 3A with parallel lines running from the lower right to the upper left to indicate parallel sides of the pads.

FIG. 3C depicts the bottom surface 110 of the packaged semiconductor device 100 of FIG. 3A, with parallel lines 142A-142D running from the lower right to the upper left to indicate parallel sides of the pads 120 and 124. As illustrated in FIG. 3C, polygonal pad 1 and polygonal pad 4 each have an inner side that is parallel to one side of each of the two equilateral triangular pads. Specifically, polygonal pad 1 has an inner side that is parallel to the nearest side of equilateral triangular pad 2 and polygonal pad 4 has an inner side that is parallel to the nearest side of equilateral triangular pad 5. The inner side of polygonal pad 1 is also parallel to a side of equilateral triangular pad 5 and to the inner side of polygonal pad 4 and the inner side of polygonal pad 4 is parallel to a side of equilateral triangular pad 2 and to the inner side of polygonal pad 1.

Figure 4:
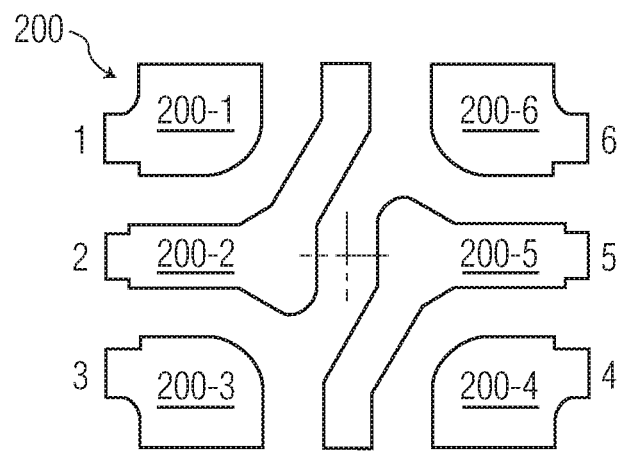
FIG. 4 depicts a top plan view of an embodiment of a leadframe that connects pads of the packaged semiconductor device of FIGS. 1A-3C.

The pad layout as shown in FIGS. 1B and 3A-3C depicts the pads 120 and 124 as exposed at the bottom surface 110 of the flat no-lead packaged semiconductor device 100. FIG. 4 depicts a top plan view of an embodiment of a leadframe 200 that connects to, or forms all of or a part of, the pads. Portions (200-1-200-6) of the leadframe in FIG. 4 are numbered to correspond to the numbered pads of FIGS. 3A-3C. For example, the numbered portions of the leadframe are electrically connected to the corresponding numbered pads.

Figure 5:
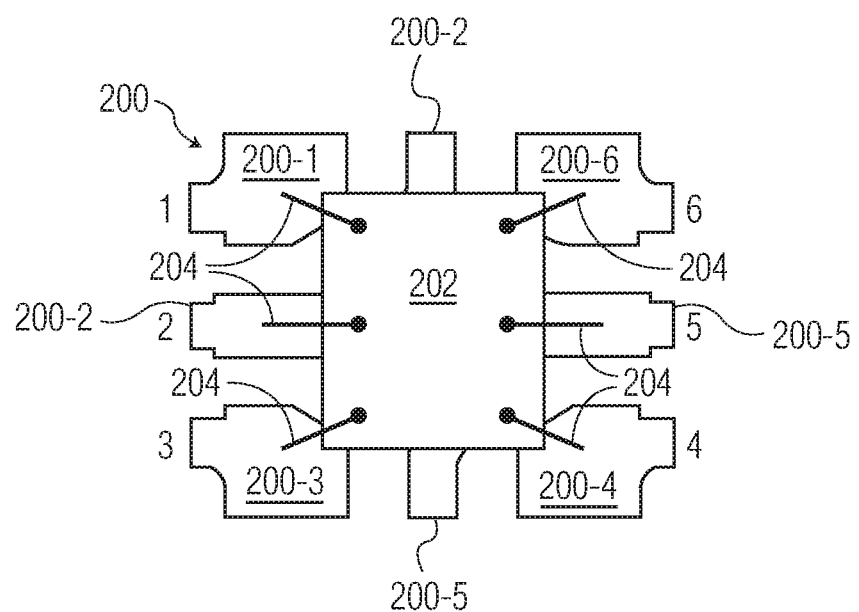
FIG. 5 depicts the leadframe of FIG. 4 after a semiconductor chip has been attached to the leadframe and conductive wires have been connected between conductive pads of the semiconductor chip and the leadframe.

As is known in the field of QFN/SON packaging, a semiconductor chip is physically attached to the leadframe by, for example, an adhesive, and conductive pads of the semiconductor chip are electrically connected to the leadframe by, for example, wire bonding. FIG. 5 depicts the leadframe 200 of FIG. 4 after a semiconductor chip 202 has been attached to the leadframe and conductive wires 204 have been connected between conductive pads of the semiconductor chip and the leadframe. As is known in the field, the conductive wires electrically connect the conductive pads of the semiconductor chip to the leadframe and the leadframe is electrically connected to the respective pads of the packaged semiconductor device. Further, as is known in the field, the leadframe, semiconductor chip, and wire bonds are enclosed within, for example, an epoxy encapsulate that forms at least a portion of the package structure 102.

Figure 6:
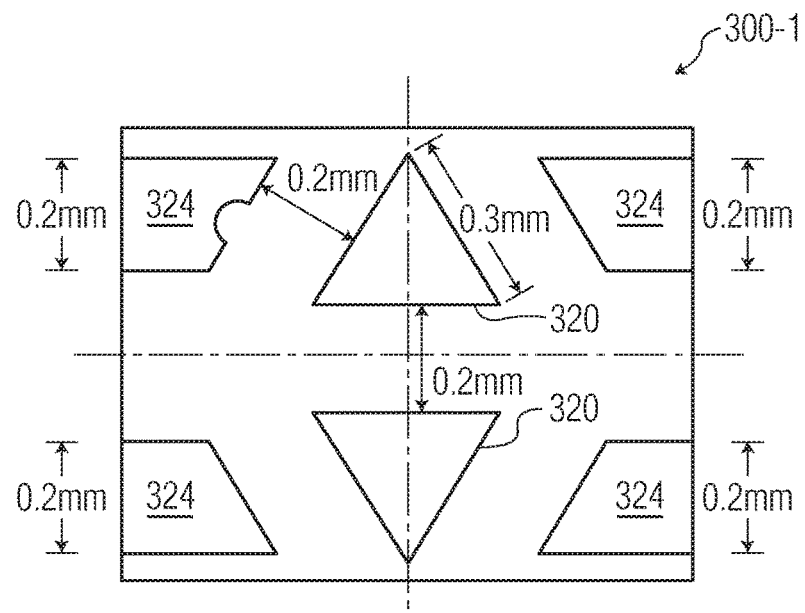
FIG. 6 depicts alternate layout of a flat no-lead packaged semiconductor device that includes two equilateral triangular pads and four trapezoidal pads oriented similar to that of FIGS. 1A-3C.

FIG. 6 depicts an alternate layout of a flat no-lead packaged semiconductor device 300-1 that includes two equilateral triangular pads 320 and four polygonal (e.g., trapezoidal) pads 324 oriented similar to that of FIGS. 1A-3C. In particular, the layout of FIG. 6 is arranged such that opposite vertices of the two triangular pads are nearest to the longest edges of the rectangular boundary.

Figure 7:
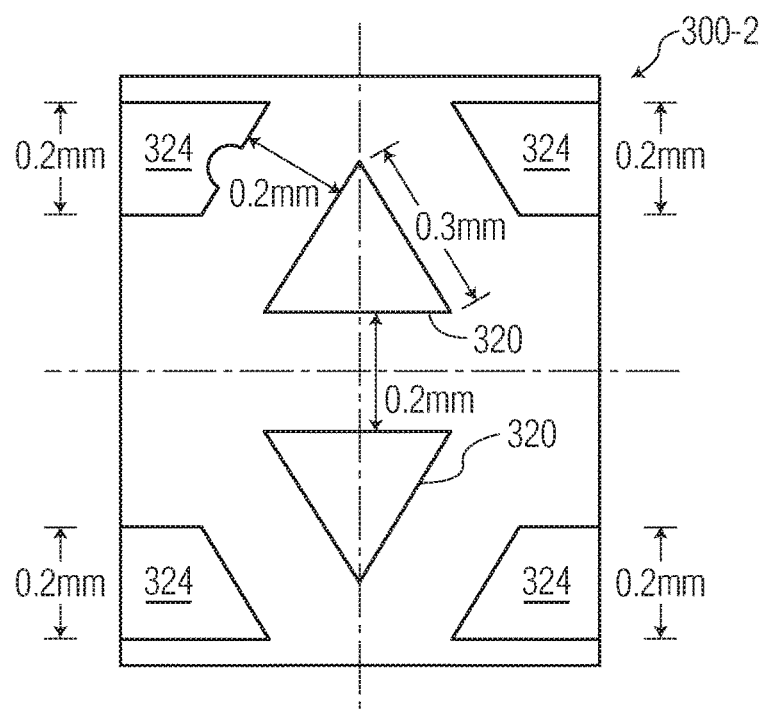
FIG. 7 depicts another alternate layout of a flat no-lead packaged semiconductor device that includes two equilateral triangular pads and four trapezoidal pads oriented similar to that of FIGS. 1A-3C.

FIG. 7 depicts another alternate layout of a flat no-lead packaged semiconductor device 300-2 that includes two equilateral triangular pads 320 and four polygonal (e.g., trapezoidal) pads 324 oriented similar to that of FIGS. 1A-3C. The arrangement of FIG. 7 is similar to the arrangement of FIG. 3A, with slightly different arrangements of the polygonal pads.

Figure 8A:
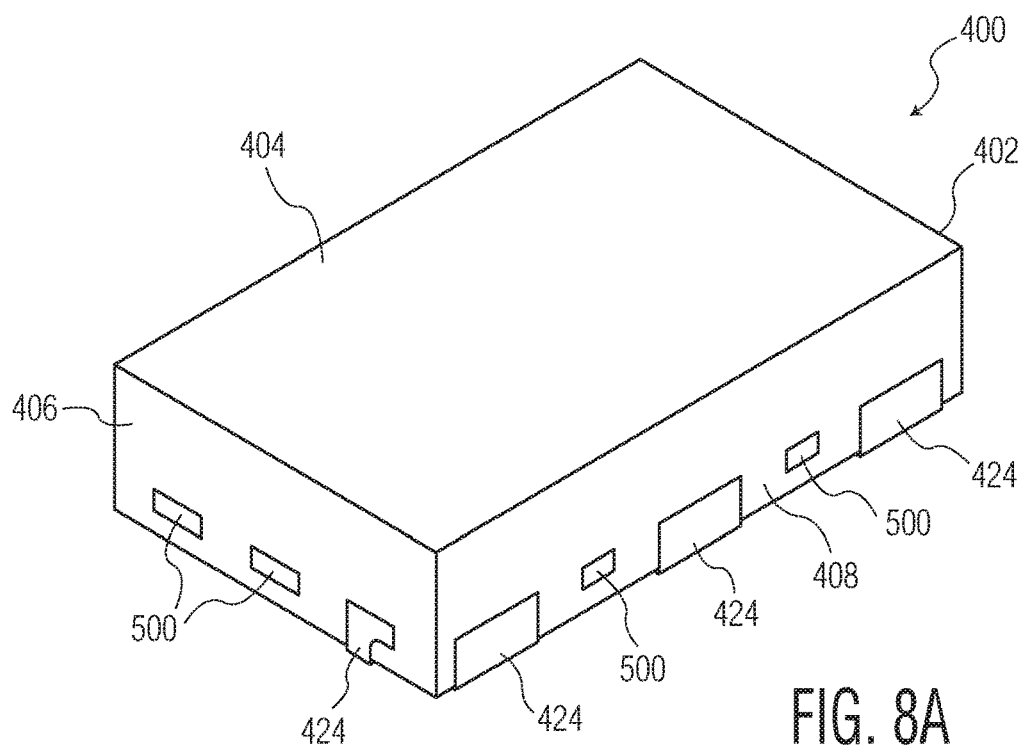
FIGS. 8A and 8B depict top and bottom perspective views of an eight-pad semiconductor device that has been packaged using a flat no-lead technique in accordance with an embodiment of the invention.
Figure 8B:
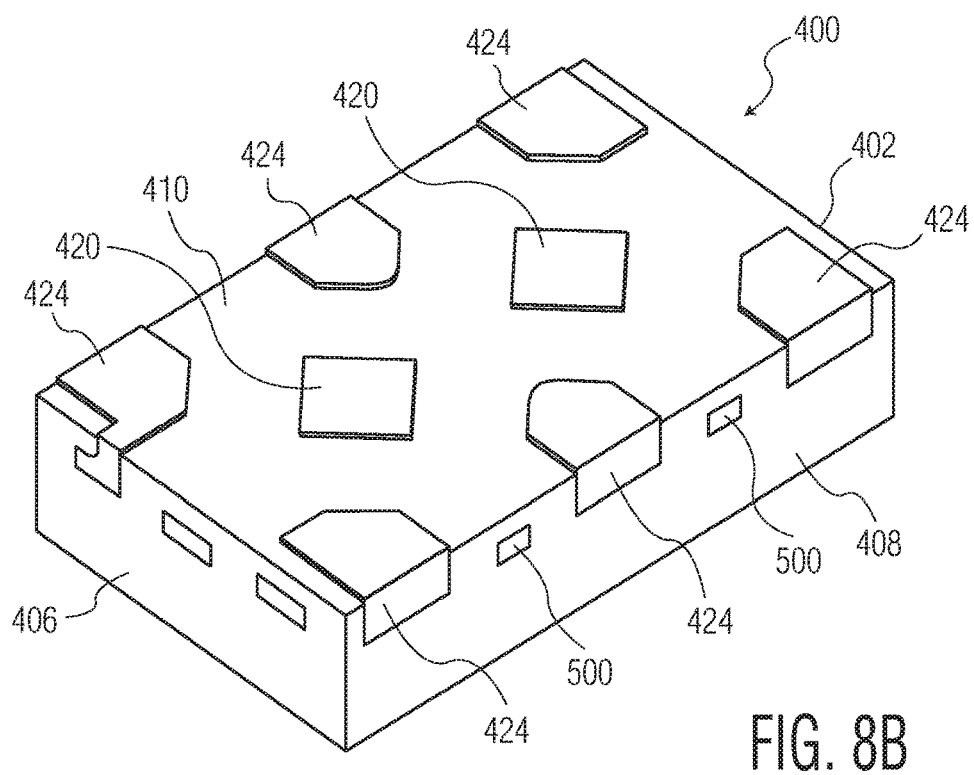

Another particularly useful flat no-lead package for logic devices includes eight exposed pads at the bottom surface that correspond to eight terminals or pins on the packaged semiconductor chip. FIGS. 8A and 8B depict top and bottom perspective views of a semiconductor device 400 with eight pads that has been packaged using a flat no-lead technique in accordance with an embodiment of the invention. In the embodiment of FIGS. 8A and 8B, the packaged semiconductor device is an eight pad flat no-lead packaged semiconductor device with dimensions of approximately 1.3 mm×0.8 mm×0.35 mm (length×width×height) that includes two interior pads and six edge pads. In the embodiment of FIGS. 8A and 8B, the two interior pads (e.g., quadrilateral pads) are exposed at the bottom surface of the package structure and located on a centerline of the bottom surface of the package structure and the six edge pads (e.g., six polygonal pads) are exposed at the bottom surface of the package structure and located at an edge of the rectangular boundary, with one edge pad in the vicinity of each corner of the rectangular boundary and two edge pads located at an edge and between the two interior polygonal pads. Additionally, each of the interior polygonal pads is located approximately in the center between four of the six edge pads and is configured such that a line running through at least one vertex of each of the interior polygonal pads is parallel to an edge of the rectangular boundary of the package structure.

The configuration of the two interior polygonal pads and the six exterior polygonal pads exhibits a large pitch, e.g., approximately 0.4 mm, and a separation distance of around 0.2 mm. Thus, the eight pad flat no-lead packaged semiconductor device provides pad separation distances that are wide enough to prevent shorting between the pads while still providing enough surface area to enable reliable connection to a printed circuit board.

FIG. 8A is a top perspective view of the eight pad flat no-lead packaged semiconductor device 400 that depicts a package structure 402 with a top major surface 404 and two side surfaces 406 and 408. As is known in the field, the top surface typically includes markings such as product markings, although no marking are shown here. Also, as illustrated in FIG. 8A, portions of the pads 424 and/or corresponding leadframe 500 are exposed at the side surfaces of the flat no-lead packaged semiconductor device.

FIG. 8B is a bottom perspective view of the eight pad flat no-lead packaged semiconductor device 400 that depicts a bottom major surface 410 and two side surfaces 406 and 408 of the package structure 402. As illustrated in FIG. 8B, two interior polygonal pads 420 and six edge polygonal pads 424 are exposed at the bottom surface of the flat no-lead packaged semiconductor device. In general, the combination of the two interior polygonal pads and the four edge polygonal pads arranged as shown in FIG. 8B provides an eight pad layout that optimizes the separation distances between the eight pads. Specifics of the pad layout are described in more detail below with reference to FIGS. 9 and 10A-10C.

Figure 9:
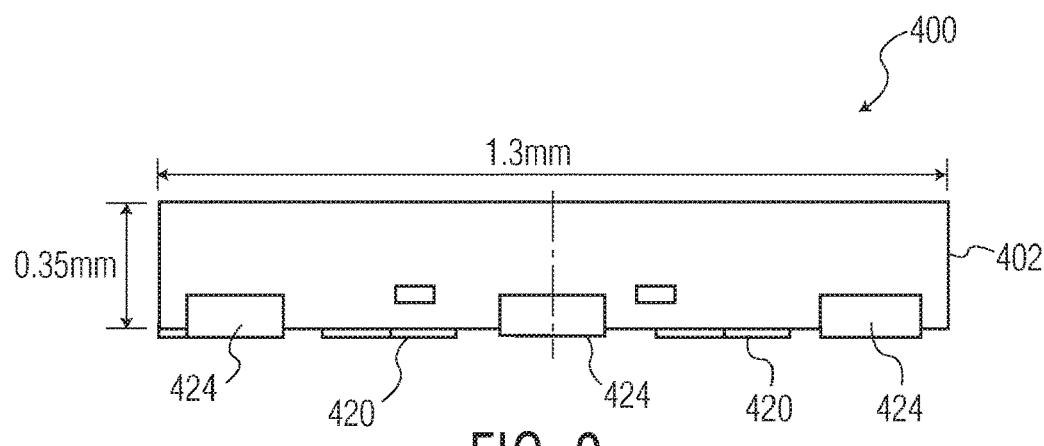
FIG. 9 is a side view of the flat no-lead packaged semiconductor device of FIGS. 8A and 8B.

FIG. 9 is a side view of the flat no-lead packaged semiconductor device 400 of FIGS. 8A and 8B that depicts the height dimension and the length dimension of the flat no-lead packaged semiconductor device. In the embodiment of FIG. 9, the height dimension is 0.35 mm and the length dimension is 1.3 mm. FIG. 9 also illustrates that the pads 420 and 424 may protrude from a plane defined by the bottom major surface 404 of the package structure 402 of the flat no-lead packaged semiconductor device 400. For example, the pads may protrude up to 20 micrometers from the bottom major surface of the package structure. In other embodiments, the pads do not protrude from the bottom major surface of the package structure, e.g., the pads are flush with the bottom major surface of the package structure.

Figure 10A:
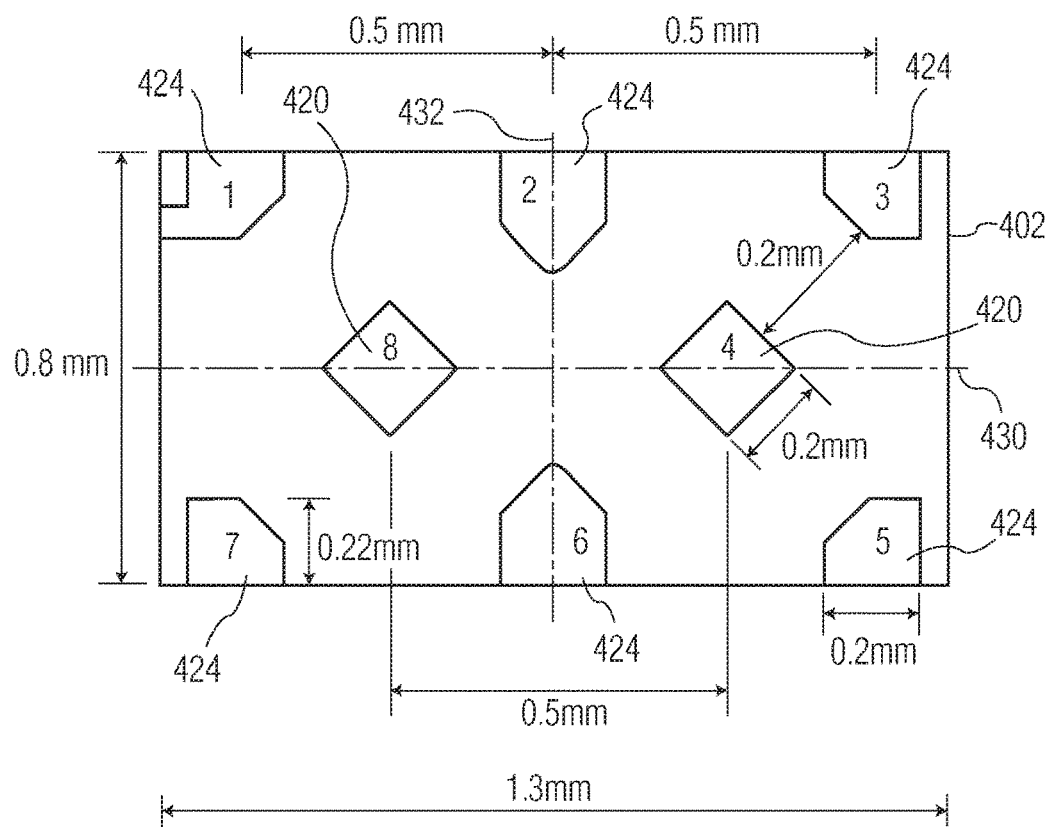
FIG. 10A is a plan view of the bottom surface of the flat no-lead packaged semiconductor device of FIGS. 8A and 8B.

FIG. 10A depicts a plan view of the bottom surface 410 of the flat no-lead packaged semiconductor device 400 that shows an embodiment of a layout of the eight pads, including the two interior polygonal pads 420 identified as pads 4 and 8 and six edge polygonal pads 424 identified as pads 1, 2, 3, 5, 6, and 7. In an embodiment, pad 8 is a ground pad for connection to a ground terminal and pad 4 is a Vcc pad for connection to a Vcc terminal, although other arrangements are possible. The basic dimensions of the flat no-lead packaged semiconductor device are described first followed by a description of the orientation of the pads. As shown in FIG. 10A, the bottom surface has a rectangular boundary of approximately 1.3 mm×0.8 mm (e.g., length×width), the two interior polygonal pads are quadrilateral pads having sides of approximately 0.2 mm, and the centers of the two interior quadrilateral pads are separated from each other by approximately 0.5 mm. In an embodiment, the dimensions of the pads and separations distances are within ±0.05 mm.

Orientation of the pads 420 and 424 is now described with reference to FIGS. 10A-10C. As shown in FIG. 10A, the two interior polygonal pads 420 are located on the horizontal centerline 430 that runs through the bottom surface 410. In the embodiment of FIG. 10A, the two interior quadrilateral pads are oriented such that two vertices of each quadrilateral pad are located on the horizontal centerline. Additionally, each of the two quadrilateral pads is oriented such that a line running through two vertices of the respective pad is parallel to the vertical centerline 432 of the bottom surface.

The six edge polygonal pads 424 are located at the edge of the rectangular boundary with four of the edge polygonal pads being located in the vicinity of the corners of the rectangular boundary and referred to as "corner pads," and the other two edge polygonal pads being located on an edge and equidistant between the two interior polygonal pads 420 and referred to as "intermediate edge pads." As shown in FIG. 10A, each of the two interior quadrilateral pads is approximately centered between four edge polygonal pads, with two of the four edge pads being the corner pads and two of the four pads being the two intermediate edge pads. Additionally, each of the interior quadrilateral pads has a first side that is parallel to a facing side of the edge polygonal pad that is nearest to the first side, a second side that is parallel to a facing side of the edge polygonal pad that is nearest to the second side, a third side that is parallel to a facing side of the edge polygonal pad that is nearest to the third side, and a fourth side that is parallel to a facing side of the edge polygonal pad that is nearest to the fourth side. For example, interior pad 1 has a first side that is parallel to the facing side of edge polygonal pad 2, a second side that is parallel to the facing side of edge polygonal pad 3, a third side that is parallel to the facing side of edge polygonal pad 7, and a fourth side that is parallel to the facing side of edge polygonal pad 8. The parallel arrangement of the various sides of the pads is described with reference to FIGS. 10B and 10C.

Figure 10B:
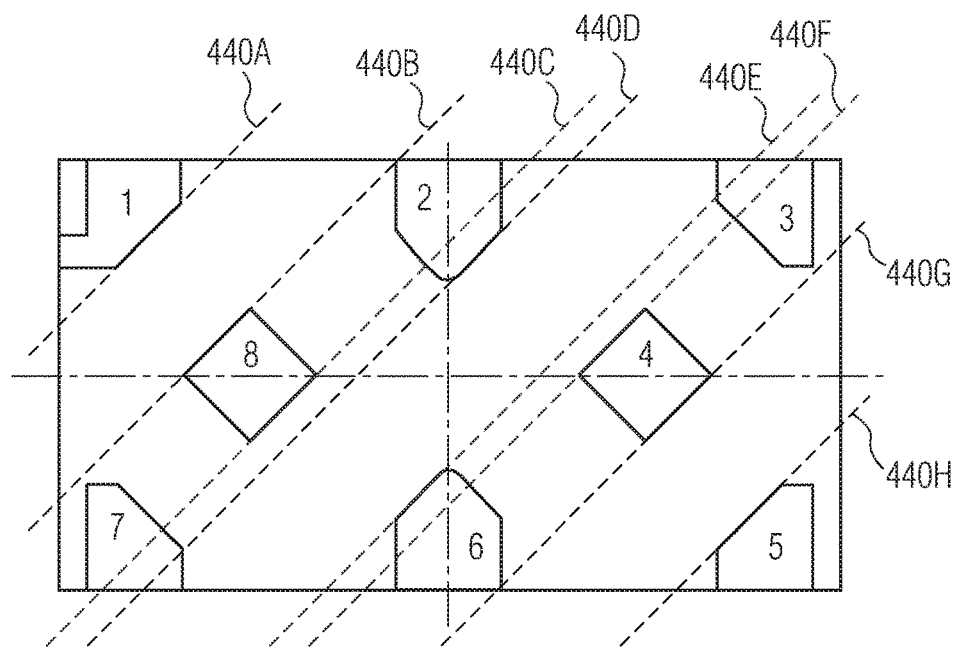
FIG. 10B depicts the bottom surface of the packaged semiconductor device of FIG. 10A with parallel lines running from the lower left to the upper right to indicate parallel sides of the pads.

FIG. 10B depicts the bottom surface 410 of the packaged semiconductor device 400 of FIG. 10A, with parallel lines 440A-440H running from the lower left to the upper right to indicate parallel sides of the pads 420 and 424. As illustrated in FIG. 10B, edge polygonal pads 2, 3, 6, and 7 each have an inner side that is parallel to two sides of each of the two inner polygonal pads.

Figure 10C:
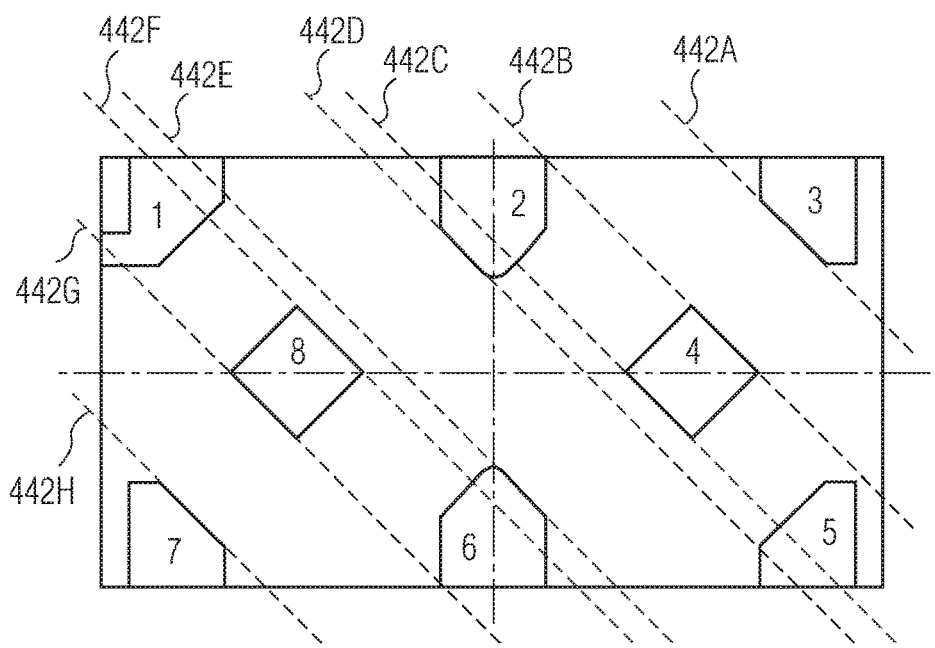
FIG. 10C depicts the bottom surface of the packaged semiconductor device of FIG. 10A with parallel lines running from the lower right to the upper left to indicate parallel sides of the pads.

FIG. 10C depicts the bottom surface 410 of the packaged semiconductor device 400 of FIG. 10A, with parallel lines 442A-442H running from the lower right to the upper left to indicate parallel sides of the pads 420 and 424. As illustrated in FIG. 10C, edge polygonal pads 3, 4, 7, and 8 each have an inner side that is parallel to two sides of each of the two inner polygonal pads.

The pad layout as shown in FIGS. 8B and 10A-10C depicts the pads 420 and 424 as exposed at the bottom surface 410 of the flat no-lead packaged semiconductor device 400. Although not shown entirely in FIGS. 8A-10C, the packaged semiconductor device 400 includes a leadframe 500 that electrically connects the packaged semiconductor chip (not shown) to the eight pads 420 and 424.

In the embodiments described above, the interior polygonal pads are electrically connected to electrically conductive pins of the packaged semiconductor device as either ground, Vcc, or input/output pads. That is, the interior polygonal pads are not provided as a heat sink. Although the above-described layouts include packaged semiconductor devices with six and eight exposed pads, packaged semiconductor devices with other numbers of exposed pads are possible. Although the interior polygonal pads are described as equilateral triangular pads and quadrilateral pads, other shaped pads are possible. For example, triangular pads, which are not equilateral triangular pads, are possible. Additionally, although certain sides are described as being parallel to each other, it is possible that the similarly arranged but non-parallel sides may be utilized. Further, although certain dimensions are provided, other dimensions of any of the elements of the flat no-lead packaged semiconductor devices are possible. Additionally, although certain dimensions are noted, in some embodiments, the dimensions may vary within certain tolerances as are known in the field.

In an embodiment, a monolithic leadframe structure is utilized to form the leadframe that connects directly to the semiconductor chip and to form the pads. In an embodiment, the leadframe is formed by etching the leadframe from the top side and from the bottom side to generate a different layout on the top side and the bottom side of the leadframe.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A semiconductor device comprising:
   a semiconductor chip;
   a package structure defining a rectangular boundary and having a bottom surface and comprising;
   only two interior polygonal pads exposed at the bottom surface of the package structure, each of the two interior polygonal pads being located on a centerline of the bottom surface of the package structure; and
   only six edge polygonal pads exposed at the bottom surface of the package structure, each of the six edge polygonal pads being located at an edge of the rectangular boundary, the six edge polygonal pads including one edge polygonal pad in the vicinity of each corner of the rectangular boundary;
   wherein each of the two interior polygonal pads has a first side that is parallel to a facing side of the edge polygonal pad that is nearest to the first side and a second side that is parallel to a facing side of the edge polygonal pad that is nearest to the second side; and
   wherein the two interior polygonal pads are configured such that a line running through and intersecting the angle at least one vertex of each of the two interior polygonal pads is parallel to an edge of the rectangular boundary of the package structure.

2. The semiconductor device of claim 1, wherein the two internal polygonal pads are quadrilaterals and the line runs through two vertices of each of the interior polygonal pads.

3. The semiconductor device of claim 2, wherein the line running through the two vertices of each of the two interior polygonal pads is a centerline of the rectangular boundary of the package structure.

4. The semiconductor device of claim 1 wherein the interior polygonal pads have side dimensions of 0.15 mm-0.25 mm.

5. The semiconductor device of claim 1 wherein the pitch of the interior polygonal pads is approximately 0.4 mm.

6. A semiconductor device comprising:
   a semiconductor chip having conductive pads;
   a package structure defining a rectangular boundary and having a bottom surface and comprising;
   only two interior polygonal pads exposed at the bottom surface of the package structure, each of the two interior polygonal pads being physically and electrically separated from each other at the bottom surface of the package structure and located on a centerline of the bottom surface of the package structure; and
   only six edge polygonal pads exposed at the bottom surface of the package structure, each of the six edge polygonal pads being located at an edge of the rectangular boundary, the edge polygonal pads including one edge polygonal pad in the vicinity of each corner of the rectangular boundary;
   wherein each of the two interior polygonal pads has a first side that is parallel to a facing side of the edge polygonal pad that is nearest to the first side and a second side that is parallel to a facing side of the edge polygonal pad that is nearest to the second side, wherein the first side and the second side of each of the interior polygonal pads are not parallel to the rectangular boundary of the package structure; and wherein the two interior polygonal pads are configured such that a line running through and intersecting the angle at least one vertex of each of the two interior polygonal pads is parallel to an edge of the rectangular boundary of the package structure;

wherein each of the two interior polygonal pads and the edge polygonal pads is electrically connected to a different one of the conductive pads of the semiconductor chip.

7. The semiconductor device of claim 6, wherein the two internal polygonal pads are quadrilaterals and the line runs through two vertices of each of the interior polygonal pads.

8. The semiconductor device of claim 7, wherein the line running through the vertices of each of the interior polygonal pads is a centerline of the rectangular boundary of the package structure.

9. The semiconductor device of claim 6 wherein the interior polygonal pads have side dimensions of 0.15 mm-0.25 mm.

10. The semiconductor device of claim 6 wherein the pitch of the interior polygonal pads is approximately 0.4 mm.

* * * * *